(12) United States Patent
Steeneken

(10) Patent No.: US 8,981,874 B2
(45) Date of Patent: Mar. 17, 2015

(54) RESONATOR DEVICE AND METHOD OF OPTIMIZING A Q-FACTOR

(75) Inventor: Peter Steeneken, Valkenswaard (NL)

(73) Assignee: NXP, B.V., Eindhoven (NL)

( * ) Notice: Subject to any disclaimer, the term of this patent is extended or adjusted under 35 U.S.C. 154(b) by 742 days.

(21) Appl. No.: 13/257,053

(22) PCT Filed: Mar. 15, 2010

(86) PCT No.: PCT/IB2010/051114
§ 371 (c)(1),
(2), (4) Date: Jan. 11, 2012

(87) PCT Pub. No.: WO2010/106485
PCT Pub. Date: Sep. 23, 2010

(65) Prior Publication Data
US 2012/0105163 A1    May 3, 2012

(30) Foreign Application Priority Data

Mar. 18, 2009  (EP) ................................. 09155513

(51) Int. Cl.
*H03H 9/24* (2006.01)
*G06F 17/50* (2006.01)
*H03H 9/02* (2006.01)

(52) U.S. Cl.
CPC ......... *H03H 9/02433* (2013.01); *H03H 9/2405* (2013.01); *H03H 9/2436* (2013.01); *H03H 2009/02354* (2013.01); *H03H 2009/0237* (2013.01); *H03H 2009/0244* (2013.01); *H03H 2009/02527* (2013.01); *H03H 2009/2442* (2013.01)

USPC .......................................................... 333/186

(58) Field of Classification Search
CPC .......................................... H03H 2009/02527
USPC .......................................................... 333/186
See application file for complete search history.

(56) References Cited

U.S. PATENT DOCUMENTS 5,627,425 A    5/1997  Kaida et al.
6,377,135 B1   4/2002  Kanai et al.
(Continued)

FOREIGN PATENT DOCUMENTS

CN    1286527 A     3/2001
WO    02/17482 A2   2/2002
(Continued)

OTHER PUBLICATIONS

Kaajakari, V. et al. "Square-Extensional Mode Single-Crystal Silicon Micromechanical Resonator for Low-Phase-Noise Oscillator Applications", IEEE Electron Device Letters, vol. 25, No. 4, pp. 173-175 (Apr. 1, 2004).
(Continued)

*Primary Examiner* — Stephen E Jones
*Assistant Examiner* — Scott S Outten

(57) ABSTRACT

A resonator device (200) comprises a base (206) comprising an anchor (204) and a vibration unit (212) connected to the anchor (204). The vibration unit (212) is configured to have a first vibration mode (218) and a second vibration mode (216) different from the first vibration mode (218). According to an embodiment, the vibration unit (212) is configured such that the first vibration mode (218) and the second vibration mode (216) destructively interfere at the anchor (204).

8 Claims, 2 Drawing Sheets

(56) References Cited

U.S. PATENT DOCUMENTS

2007/0052498 A1   3/2007   Pan et al.
2008/0218295 A1*  9/2008   Lutz et al. .................... 333/186

FOREIGN PATENT DOCUMENTS

WO    03/021634 A2    3/2003
WO    2006/124303 A1  11/2006

OTHER PUBLICATIONS

Lee, J. et al. "Eigenvalue Analysis of Timoshenko Beams and Axisymmetric Mindlin Plates by the Pseudospectral Method", Journal of Sound and Vibration, vol. 269, pp. 609-621, (2004).

Kaajakari, V. et al. "Nonlinear Limits for Single-Crystal Silicon Microresonators", Journal of Micromechanical Systems, vol. 13, No. 5, pp. 715-724 (Oct. 2004).

Clark, J. R. et al., "High-Q UHF Micromechanical Radial-Contour Mode Disk Resonators", Journal of Micromechanical Systems, vol. 14, No. 6, p. 1298 (Dec. 2005).

Bindel, D.S. et al. "Anchor Loss Simulation in Resonators", retrieved from the internet at: www.cims.nyu.edu/~dbindel/papers/mems05.pdf, 4 pgs. (2005).

Bindel, D. et al. "Elastic PMLs for Resonator Anchor Loss Simulation", International Journal for Numerical Methods in Engineering, pp. 789-818 (2005).

Steeneken, P. G. "Parameter Extraction and Support-Loss in MEMS Resonators", Proc. Comsol Conference, 6 pgs., 2007, Grenoble.

Xie, Y. et al. "1.52-GHz Micromechanical Extensional Wine-Glass Mode Ring Resonators", IEEE Transactions on Ultrasonics, Ferroelectrics and Frequency Control, vol. 54, No. 4, pp. 890-907 (Apr. 1, 2008).

International Search Report for Int'l Patent Application No. PCT/IB2010/051114 (Jun. 23, 2010).

Office Action from counterpart application CN 201080012037.6 (Feb. 27, 2014).

* cited by examiner

RESONATOR DEVICE AND METHOD OF OPTIMIZING A Q-FACTOR

FIELD OF THE INVENTION

The present invention relates to the field of resonator devices and in particular to the field of microelectromechanical systems (MEMS) resonators.

BACKGROUND OF THE INVENTION

WO 03/021634 A2 relates to a micromechanical resonator fabricated on a semiconductor die. The resonator comprises at least two vibratable members, that are closely spaced relative to a wavelength associated with their vibrating frequency and driven to vibrate one half of a vibration period out of phase with each other, i.e. to mirror each others motion and leading to a destructive interference that suppress leakage of acoustic energy from the vibratable members into the die and improve the Q-factor of the resonator.

In view of the above-described situation there still exists a need for a resonator device with a high Q-factor and an improved technique that allows for providing a resonator device with a high Q-factor.

SUMMARY OF THE INVENTION

This need may be met by the subject-matter according to the independent claims. Advantageous embodiments of the present invention are described by the dependent claims.

According to a first aspect of the herein disclosed subject matter, there is provided a resonator device comprising a base. The base has one or more anchors. The resonator device further comprises a vibration unit connected to the anchor(s). The vibration unit is configured to have a desired first vibration mode and is further configured to have a second vibration mode different from the first vibration mode, wherein the first vibration mode and the second vibration mode destructively interfere at the anchor(s).

Herein, the term "vibration mode" is considered as being identical with "resonance mode" or "eigenmode", which is also a commonly used term. Hence the "vibration mode" is an inherent property of the resonator unit.

As a result, a movement of the at least one anchor due to vibration of the vibration unit is reduced or even eliminated. As a result, energy leakage to the anchor is reduced and hence the Q-factor of the resonator device is increased.

According to an embodiment, the desired first vibration mode corresponds to a desired resonance frequency which might be used in any suitable application, for example as a frequency reference. Further exemplary uses of the resonator device are timing devices or filters.

According to a further embodiment, the second vibration mode corresponds to a second resonance frequency of the resonator device.

According to a further embodiment of the first aspect, the vibration unit is a single vibration element which is configured to provide both said first vibration mode and said second vibration mode. This embodiment may allow for reduced manufacturing costs since only a single element is required for forming the vibration unit.

According to a further embodiment, configuring the vibration unit comprises adapting the geometry of the vibration unit such that the vibration unit provides the desired first vibration mode and the second vibration mode.

According to a further embodiment of the first aspect, the base comprises a single anchor and the vibration unit is plate-shaped, having a central portion which is connected to the single anchor. For example, the vibration unit might be formed by a single disk, for example a circular disk, of which the diameter and the thickness are configured so as to provide the first vibration mode and the second vibration mode.

According to a further embodiment of the first aspect, the vibration unit comprises first partial unit providing the first vibration mode and a second partial unit attached to the first partial unit, wherein the second partial unit provides the second vibration mode. This embodiment may have the advantage of allowing the first partial unit which provides the first vibration mode in almost any desired shape, wherein the second partial unit provides for a reduced movement of the anchor. According to a further embodiment, the second partial unit is formed as a separate element which is attached to the first partial unit.

According to a further embodiment of the first aspect, the second partial unit is located proximate the anchor.

According to a further embodiment of the first aspect, the second partial unit is a beam, the centre of which is attached to the first partial unit.

According to a further embodiment, two or more second partial units are provided. For example, according to a further embodiment, for each anchor one second partial unit is provided which is attached to the first partial unit in the vicinity of the respective anchor. According to still further embodiments, two or more second partial units, which may provide different second vibration modes, are attached to the first partial unit in the vicinity of each anchor.

According to a further embodiment of the first aspect, the base comprises at least one further anchor and the first partial unit comprises a plate-shaped element and at least two tabs, wherein each tab connects the plate-shaped element to one of the at least two anchors.

According to a further embodiment, at least one of the second partial units is attached to each of the tabs.

According to a further embodiment of the first aspect, one mode of the first vibration mode and the second vibration mode is an extensional mode and the other mode is a flexural mode. For example, according to an embodiment, the first vibration mode is an extensional mode and the second vibration mode is a flexural mode.

According to a further embodiment of the first aspect, the ratio of the resonance frequency of the second vibration mode over the resonance frequency of the first vibration mode has a value between 0.9 and 1.1.

According to a further embodiment of the first aspect, the resonance frequency of the second vibration mode is larger than the resonance frequency of the first vibration mode. According to a further embodiment, the resonance frequency of the second vibration mode is substantially equal to the resonance frequency of the first vibration mode. For example, the vibration unit may be configured such that the resonance frequency of the second vibration mode is very close to the resonance frequency of the first vibration mode, but slightly larger than the resonance frequency of the first vibration mode.

It should be understood that even if the resonance frequency of the second mode differs from the resonance frequency of the first mode, the vibration unit may be operated at a specific frequency or frequency spectrum, e.g. the resonance frequency of the first mode. The resonator may simultaneously operate at many frequencies or in a frequency range, for example if it is used for filtering purposes.

According to a further embodiment of the first aspect, the resonator device is a microelectromechanical system (MEMS). For example, according to a further embodiment, the resonator device is composed of materials and is formed by processes typically used in fabricating microelectronic circuits or integrated circuits.

According to a second aspect of the herein disclosed subject-matter, a method of optimizing a Q-factor of a resonator device is provided, the method comprising a) configuring a vibration unit which is connected to an anchor to have a desired first vibration mode, and b) configuring the vibration unit to have a second vibration mode different from the first vibration mode, wherein the first vibration mode and the second vibration mode destructively interfere at the anchor.

According to a further embodiment of the second aspect, the configuring of the vibration unit to have the first vibration mode comprises configuring lateral dimensions of a plate-shaped element of the vibration unit such that the plate-shaped element has the first vibration mode in the form of an extensional mode. According to a further embodiment, the configuring of the vibration unit to have the second vibration mode comprises configuring a thickness of a plate-shaped element such that the plate-shaped element has the second vibration mode in the form of a flexural mode. According to a further embodiment, the vibration unit comprises a single plate-shaped element which is configured according to the latter two embodiments of the second aspect.

According to a further embodiment of the second aspect, configuring a vibration unit to have a first vibration mode comprises configuring a vibration unit to have a first partial unit which provides a first vibration mode and configuring the vibration unit to have the second vibration mode comprises configuring and attaching to the first partial unit at least one second partial unit, wherein the second partial unit provides the second vibration mode and forms the vibration unit together with the first partial unit.

According to further embodiments of the second aspect, the resonator device is configured according to the first aspect or an embodiment thereof.

Embodiments of the herein disclosed subject-matter are based on the idea that the Q-factor of a resonator device can be further increased by providing destructive interference of two different vibration modes before movements of a vibration unit according to one of the these modes reaches an anchor to which the vibration unit is connected.

Herein, the expression that the first vibration mode is different from the second vibration mode means that the vibration modes differ from each other in at least one parameter, for example orientation with respect to the vibration unit, frequency, amplitude, etc.

In the following, there will be described exemplary embodiments of the subject-matter disclosed herein with reference to a resonator device and to a method of optimizing a Q-factor of a resonator device. It has to be pointed out that of course any combination or features relating to different aspects of the herein disclosed subject-matter is also possible. In particular, some embodiments have been described with reference to apparatus type claims whereas other embodiments have been described with reference to method type claims. However, a person skilled in the art will gather from the above and from the following description that unless otherwise notified, in addition to any combination of features belonging to a single aspect also any combination between features relating to different aspects or embodiments, for example even between features of apparatus type claims and features of method type claims, is considered to be disclosed with this application, even without explicitly mentioning such combinations of features.

The aspects defined above and further aspects and embodiments of the present invention are apparent from the embodiments and examples to be described hereinafter and are explained with reference to these embodiments and examples.

The invention will be described in more detail hereinafter with reference to exemplary embodiments and the drawings but to which the invention is not limited.

DETAILED DESCRIPTION OF THE DRAWINGS

Figure 1:
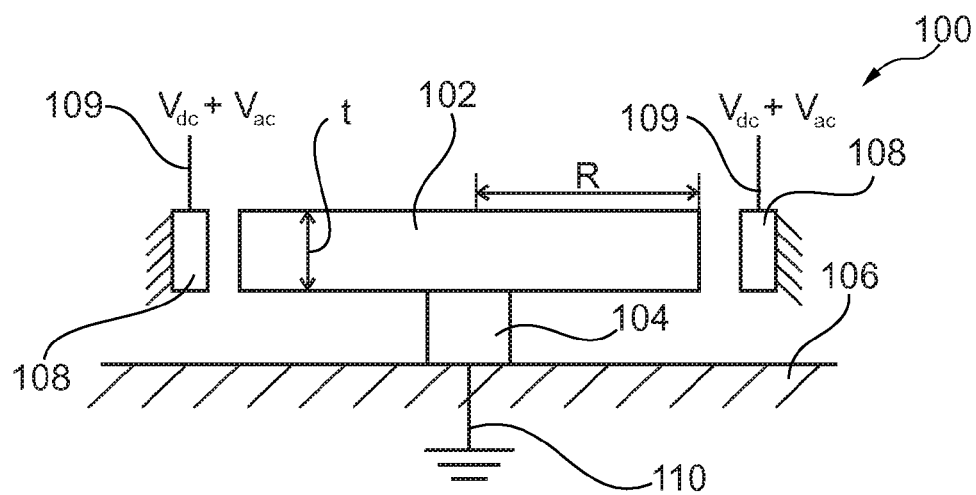
FIG. 1 shows a resonator device according to embodiments of the herein disclosed subject-matter.

The illustration in the drawings is schematic. It is noted that in different figures, similar or identical elements are provided with the same reference signs or with reference signs which differ from the corresponding reference signs only within the first digit or by an appended character.

MEMS resonators are promising candidates to replace quartz crystals as frequency reference and timing devices. Embodiments of MEMS resonators are mechanical filters of electrical signals. To have a maximum filtering selectivity, it is important that the energy loss is low, which means that the Q-factor should be high. There are several sources of energy loss in MEMS resonators, including intrinsic thermoelastic material damping, gas-damping and surface damping. However often these damping mechanisms can be minimized such that the dominant remaining damping mechanism is anchor/support damping, which is caused by energy leakage from the resonator to the surroundings via the supports by which the resonator is suspended. The herein disclosed subject matter provides principles of designing the resonator such that this leakage is minimized and the Q-factor is maximized.

One achievement of the inventors is to provide an insight to the mechanisms of energy loss of a MEMS resonator, which was verified by simulating MEMS resonators using a finite element analysis which can be done e.g. by Comsol.

The principles of the method of simulation were described in the article "P. G. Steeneken, J. J. M. Ruigrok, S. Kang, J. T. M. van Beek, J. Bontemps and J. J. Koning, *Parameter Extraction and Support-Loss in MEMS Resonators*", Proc. Comsol conference 2007, Grenoble, p. 725".

MEMS resonators are usually structures whose lateral dimensions are much larger than the vertical dimension (however, the invention is not limited hereto). Both flexural and extensional resonances may exist. For practical applications the lateral extensional resonances are most often used, since they usually offer higher resonance frequencies, more linearity and/or lower impedances. Typically these extensional resonators are suspended by one or more anchors which are clamped/fixed at a nodal point (a point which is at a constant position during the resonance). The main advantage of this clamping method is that the energy which is lost via the anchor(s) is low. However as can be understood from elastic deformation theory, the thickness of an elastic plate decreases when it is strained in lateral direction. Hence the displacement of the anchor is not zero, as there is an inward motion of the anchor when the ends of the resonator (plate) move outward. This motion of the anchor can result in the generation of waves, which travel via the anchor to the substrate. The energy carried by these waves is lost from the resonator and thus reduces its Q-factor. A comparison of the measured Q-factors with the calculated Q-factors demonstrated that this support damping is indeed the dominant damping mechanism in these extensional resonators.

FIG. 1 shows a cross-section of a micromechanical disk resonator device 100 (MEMS resonator). The axially symmetric structure consists of a disk 102, for example a circular diamond disk having a thickness t and a radius R. The disk 102 forms the vibration unit of the resonator device 100. The vibration unit 102 is connected to an anchor 104. According to an embodiment, the anchor 104 is formed by a polysilicon stem. The stem 104 is connected to a substrate 106, for example a silicon substrate. According to an embodiment, the connection between the vibration unit 102 and the anchor 104 is realized by well-known bonding techniques. According to other embodiments, the vibration unit 102 and the anchor 104 may be formed from the same element, for example by etching techniques, for example techniques known in integrated circuit manufacturing. The connection between the anchor 104 and the substrate 106 may also be realized by bonding, in one embodiment. According to other embodiments, the anchor may be formed with the substrate from a single piece.

The vibration unit 102 may be actuated according to well-known principles, for example by applying a voltage 109, e.g. a DC bias voltage $V_{dc}$ plus an AC voltage $V_{ac}$, to electrodes 108 and connecting the anchor 104 to ground 110.

For cases where the radius R is much larger than the thickness t (R>>t), the resonance frequency of the extensional modes is given by $$f_{ext,n} = \frac{\delta_n}{2\pi R}\sqrt{\frac{E}{\rho(1-v^2)}} \quad \text{where } \delta_{1,2,...} = 1.93, 5.35, 8.55 \ldots \quad (1)$$

From equation (1) it is apparent that the extensional modes are independent of the thickness t in this approximation and only depend on the radius R and some material properties. Hence, the vibration unit can be configured to have a desired first vibration mode in the form of an extensional mode by respectively configuring the radius of the disk 102.

The resonance frequencies of the flexural modes are approximately $$f_{flex,m} = \frac{\lambda_m^2}{2\pi R^2}\sqrt{\frac{Et^2}{12\rho(1-v^2)}} \quad \text{where } \lambda_{1,2,...} = 3.20, 6.31, 9.44 \quad (2)$$

again for R>>t. In equations (1) and (2) E is Young's modulus, $v$ is Poisson's ratio and $\rho$ is the density of the disk.

From equation (2) it is apparent that the resonance frequency of the flexural modes of the disk depend on the radius R as well as on the thickness t of the disk 102. Hence, the vibration unit can be configured to have a second vibration mode in the form of a flexural mode by respectively configuring the thickness t of the disk 102.

This allows for configuring the first vibration mode and the second vibration mode of the disk 102 such that these different vibration modes destructively interfere at the anchor 104. As a result, a movement of the anchor 104 is reduced and the Q-factor is increased. The disk-shaped vibration unit 102 has the advantage that for R>>t the frequency of the extensional modes $f_{ext}$ can be adjusted almost independently from the frequency of the flexural modes, thus providing for an relatively easy configuration of the vibration unit 102. However, it should be noted that for more complicated vibration unit structures a respective configuration can also be performed, e.g. by using finite element techniques.

In a first approximation, the first vibration mode and the second vibration mode are considered to destructively interfere at the anchor if the resonance frequency of the first vibration mode equals the resonance frequency of the second vibration mode. From equations (1) and (2) it can be seen that at certain radius to thickness ratios R/t we have $f_{ext}=f_{flex}$. For the lowest extensional mode ($\delta 1=1.93$) this occurs for example at $R_{11}=1.53$ t, $R_{12}=5.95$ t and $R_{13}=13.32$ t. However, it should be kept in mind that equations (1) and (2) are only valid if R is much greater than t (R>>t). Further, also the radius and material properties of the anchor can have an effect on the geometry at which $f_{ext}=f_{flex}$.

Figure 2:
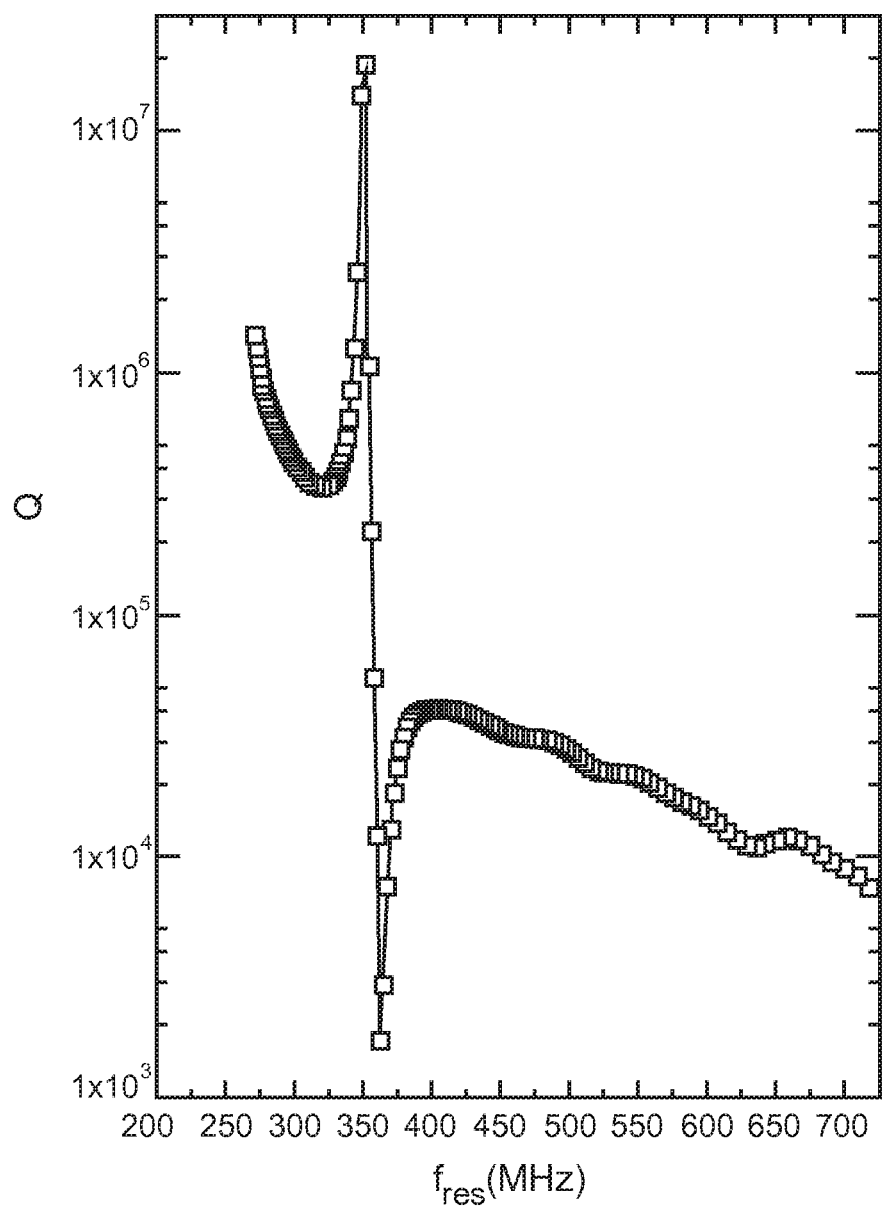
FIG. 2 shows a simulated Q-factor over a resonance frequency of a desired vibration mode for the resonator device of FIG. 1.

Using simulation codes which were described in the article "P. G. Steeneken, J. J. M. Ruigrok, S. Kang, J. T. M. van Beek, J. Bontemps and J. J. Koning, *Parameter Extraction and Support-Loss in MEMS Resonators*", Proc. Comsol conference 2007, Grenoble, p. 725.", the Q-factor of the diamond disk resonance can be calculated. The results are shown in FIG. 2 where the simulated Q-factor of the resonator with t=3 μm is shown over varying disk radius (and hence varying resonance frequency $f_{res}$ of the first vibration mode). Since the first vibration mode is an extensional mode in the exemplary embodiment, this resonance frequency $f_{res}$ is denoted as $f_{ext}$ in the following. The simulated Q-factor shows a resonance at a frequency of about 350 MHz which corresponds to a disk radius of about 14.9 μm. This is quite close to $f_{ext,1}=f_{flex,2}$ that is expected around $R_{12}=4.52$ t=13.56 μm.

Simulations of the resonance frequency as a function of radius for a number of modes of the disk resonance 102, calculated using finite element analysis, shows that the contour extensional mode crosses the flexural mode line at a radius of 14.9 μm. The simulations further show that it is likely that the Q-factor is high because there is a destructive interference of a flexural and extensional mode. The exact amount of mixing of the first vibration mode and the second vibration mode needed to get destructive interference can be determined by careful simulations. In the specific case of FIG. 1, having a single disk-shaped vibration unit which is connected to a single anchor at a central portion of the disk it seems that the flexural mode has a much larger contribution to the stem motion which implies that a small component or flexural contribution can be sufficient to cancel the stem motion of the extensional mode. The amount of mode mixing depends strongly on the frequency separation of both modes. Therefore, the radius at which the maximal Q-factor is obtained is at a larger radius (15.45 μm) than the frequency at which the modes are at equal frequency (14.9 μm). The minimum Q-factor is very close to this value (14.85 μm), probably the mixing is then maximal and the mixed-in flexural component induces a large stem motion (much larger than that caused by the intrinsic extensional mode). Moreover, for maximal Q the relative phase of the modes should be correct (a 180° relative phase shift occurs at $f_{flex}=f_{ext}$).

Figure 3:
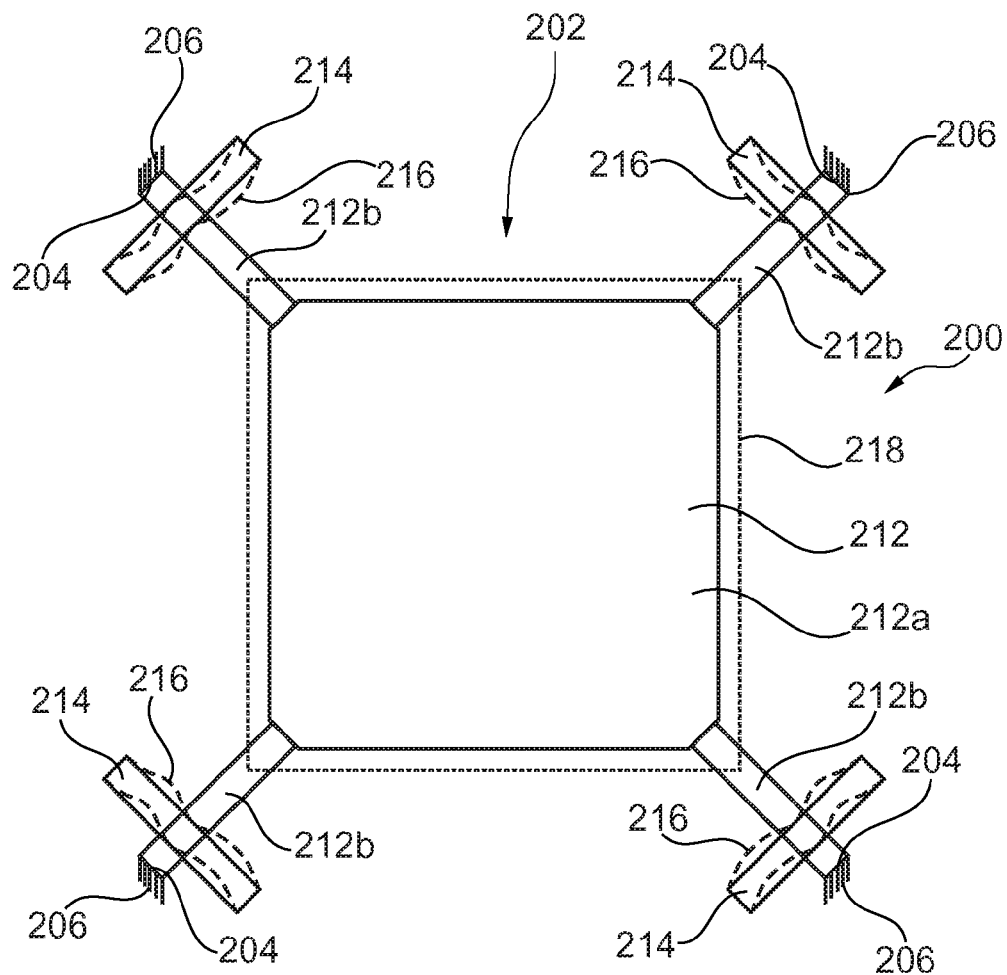
FIG. 3 shows a further resonator device according to embodiments of the herein disclosed subject-matter.

FIG. 3 shows a further resonator device 200 according to embodiments of the herein disclosed subject-matter. The resonator device 200 comprises a base 206 with an anchor 204 and a vibration unit 202 connected to the anchor 204. The vibration unit 202 comprises a first partial unit 212 with a plate-shaped element 212a and four tabs 212b connecting the plate-shaped element 212a to the anchors 204.

The vibration unit 202 further comprises at least one second partial vibration unit 214 which provides said second vibration mode. According to an embodiment, each second partial vibration unit is formed by a single element e.g. a beam. In the case that the first partial vibration unit comprises tabs, which connect to the respective anchors, the single elements of the second partial vibration unit 214 may be positioned transverse to the tabs 212b. In FIG. 3 the vibrational motion of the second partial unit 214 is indicated by the dashed lines 216. The vibrational motion of the plate-shaped element 212a of the first partial vibration unit 212 is indicated by the dashed line at 218. (modes 216 and 218 are either have both vibrational motion or have flexural and extensional motion).

According to an embodiment, the second partial vibration unit 214 is attached to the first partial vibration unit 212 proximate the respective anchor 204, as shown in FIG. 3. However, it should be understood that according to other embodiments, the second partial vibration units can be attached to the first partial vibration unit at any different location, which provides for destructive interference of the two different modes at the anchor(s). According to an embodiment, as shown by the movement indicating lines 216 and 218 in FIG. 3, the first vibration mode of the first partial vibration unit 212 is an extensional mode and the second vibration mode of the second partial vibration unit 214 is a flexural mode. According to an embodiment, the resonance frequency of the second vibration mode of the beams 214 is equal or at least substantially equal to the resonance frequency of the first mode provided by the first partial vibration unit 212. According to other embodiments, the resonance frequency of the second mode might be larger, e.g. slightly larger than the resonance frequency of the first mode. Simulations turned out that at least for the configurations shown in FIG. 1 and FIG. 2 a high Q-factor can be obtained by configuring the resonance frequency of the second (vibration) mode higher than the resonance frequency of the first (vibration) mode. This does however not exclude the possibility that for other configurations (or even also for the configurations shown in FIG. 1 and FIG. 2) other frequency values and differences result in a high Q-factor. Optimal frequency values and differences may be obtained e.g. by finite element analysis.

Hence, for other configurations, a maximum Q-factor may be obtained for a resonator device by making the resonance frequency of the second mode smaller than the resonance frequency of the first mode.

It should be noted that the second partial vibration unit (e.g. flexural elements such as beams) may have properties of springs. However, in order to provide the well defined second vibration mode according to embodiments of the herein disclosed subject matter, the second partial unit (e.g. flexural element) must not only be regarded as a spring but rather as a spring-mass system with a specific resonance frequency which can be designed separately from the resonance frequency of the main resonator (e.g. the first partial vibration unit). Further it should be noted that the second partial unit will not reduce the stress in the anchors if they this stress is applied statically and hence the second partial unit does not provide for stress/strain relief in the main resonator (first partial unit). As a result, according to an embodiment, the resonance frequency of the first vibration mode is unchanged or substantially unchanged by adding a second partial vibration unit as disclosed herein.

In the following, an exemplary method for providing a resonator device according to embodiments of the herein disclosed subject matter is explained in more detail. However, other methods or additional method steps may be performed. Further at least some of the method steps identified below may be carried out in a different order.

According to an embodiment, the method of optimizing a Q-factor of a resonator device comprises:

1. Configuring a vibration unit to have a first desired vibration mode.
2. Configuring the vibration unit to have a second vibration mode different from the first vibration mode, wherein the first vibration mode and the second vibration mode destructively interfere at the anchor.

A further method of optimizing a Q-factor of a resonator device according to embodiments of the herein disclosed subject-matter comprises:

1. Configuring a vibration unit connected to an anchor to have a first vibration mode and a second vibration mode different from the first vibration mode, wherein the frequency of the first vibration mode and the second vibration mode are the same.
2. Optionally varying the frequency of the second vibration mode to increase the Q-factor of the resonator. For example, the second vibration mode is varied such that the resonance frequency of thus obtained second vibration mode is within a predetermined interval with the ratio of the resonance frequency of the second mode over the resonance frequency of the first mode having a value between 0.9 and 1.1.

A further method of optimizing a Q-factor of a resonator device comprises finding the optimal geometry of a resonator having a disk-shaped vibration unit. Exemplary embodiments of such a method may comprise:

1. Finding the lateral dimensions which give the desired resonance frequency of the extensional mode (this resonance frequency does not depend on thickness as long as the radius R is much greater than the thickness t (R>>t)).
2. Finding the thickness $t_{eq}$ for which the resonance frequency of the flexural mode $f_{flex}$ is equal to the resonance frequency of the extensional mode $f_{ext}$ ($f_{flex}(t_{eq})=f_{ext}(t_{eq})$) and choose a suitable flexural mode.
3. Decreasing the thickness slightly ($t<t_{eq}$) such that $f_{flex}<f_{ext}$ (see equations (1) and (2)).
4. Optionally using a finite element code or a trial and error method to optimize the Q-factor. For use with a finite element code a method as described in the article "P. G. Steeneken, J. J. M. Ruigrok, S. Kang, J. T. M. van Beek, J. Bontemps and J. J. Koning, *"Parameter Extraction and Support-Loss in MEMS Resonators"*, Proc. Comsol conference 2007, Grenoble, p. 725" may be used.

The following section refers to some details of destructive interference between two different modes of a vibration unit.

A mechanical resonator made of many atoms can be considered as many masses which are interconnected by springs. If damping is neglected, the resonator has many vibrational modes and each of them has a corresponding vibrational frequency. For each vibrational mode, the motion of each of the atoms is at this same vibrational frequency.

Some of the springs will be connected to the anchors and will thus exert a force on the anchor. The rate at which power is lost via the anchors by mechanical waves which travel away from the resonator will depend on the vibrational mode. The ratio of the stored energy with this lost power is a measure for the Q-factor. Therefore the Q-factor will depend on the vibrational mode.

If this power loss, or damping, is taken into account, the Q-factor becomes finite, and the spectral peak-width of each vibrational mode broadens. The width of the vibrational peak at half its maximum value is approximately equal to $f_{res}/Q$, where $f_{res}$ is the vibrational frequency. As a consequence of this broadening the resonance can also be excited at frequencies which are slightly different from the undamped vibrational frequency. This invention makes use of this fact to control the amount of power loss by exciting two different modes at one frequency, even though the undamped vibrational frequencies of the two modes is different.

Without being bound to theory, in the following a possible explanation of the above described situation will be given.

In one embodiment of this invention the first vibrational mode has a high Q-factor Q1 and the second vibrational mode has a low Q-factor Q2. Note that this requirement for high and low Q-factor suggests to use a first extensional mode and a second flexural mode, because this corresponds with the observation that extensional modes usually have a higher Q-factor than flexural modes.

If the device is driven at or close to the first vibrational frequency f1, most of the energy E1 will be stored in the first vibrational mode, but because of the broadened resonance peak the second vibrational mode will also be excited and store some energy E2. If interference effects are neglected, the power P1 and P2 lost to the substrate from the first and second modes is roughly proportional to the respective Q-factor:

$$P1 \propto 1/Q \; P2 \propto 1/Q2$$

However if both modes destructively interfere at the anchor, the total power loss can be reduced and the effective combined Q-factor Qtot can become higher than Q1.

Because Qtot depends not only on Q1, Q2 and the frequency difference f1-f2 of the two modes but also on the effective masses, the coupling between the modes and the properties of the anchor, it is difficult to give an exact expression for the optimal value for f1-f2.

For a given value of Q1 (preferably as high as possible) the value of Q2 should be tuned such that the difference between f1 and f2 is not too small and not too big. If the difference is very small the actual value of the total Q-factor Q-total will depend very strongly on Q1 and Q2 and it will be very difficult to manufacture identical resonators. If the ratio is too large, it will be difficult to prevent the interference with other modes, and it is probably difficult to use the compensation mechanism between modes whose Q-factor differs more than a factor of 100 (Q1/Q2>100). It is noted that for an exemplary implementation of an embodiment a good guess is, $100<Q2<10000$ and $1000<Q1<1000000$ and the value of $|f1-f2|/f1$ should be between $1/10000$ and $1/10$. From simulations it appears that at least for some embodiments the optimal frequency spacing between the two vibration modes, f1-f2, increases when Q2 reduces.

It should be noted that the term "comprising" does not exclude other elements or steps and the "a" or "an" does not exclude a plurality. Also elements described in association with different embodiments may be combined. It should also be noted that reference signs in the claims should not be construed as limiting the scope of the claims.

In order to recapitulate the above described embodiments of the present invention one can state:

A resonator device comprises a base comprising an anchor and a vibration unit connected to the anchor. The vibration unit is configured to have a first vibration mode and a second vibration mode different from the first vibration mode. According to an embodiment, the vibration unit is configured such that the first vibration mode and the second vibration mode destructively interfere at the anchor. According to another embodiment, the vibration unit is configured such that the first vibration mode and the second vibration mode have resonance frequencies that differ at most by 10%.

According to an embodiment, a maximum in Q-factor can be reached by adjusting the design of the vibration unit to adjust the amount of mode mixing between a pure extensional mode and a pure flexural mode. This optimum Q-factor is reached by adjusting the design such that the mixing of these modes results in a composite mode for which the anchor is not moving. The amount of mixing is usually maximal when the frequencies of the flexural and extensional modes are equal ($f_{ext}=f_{flex}$). If the flexural mode frequency is slightly larger ($f_{flex}$ larger $f_{ext}$) the displacement of these modes can destructively interfere at the anchor. This can eliminate the generation of surface waves and can result in an increase in Q-factor of the resonator. Similarly at a slightly larger/smaller radius, constructive interference at the anchor can lead to a reduction of the Q-factor. Generally, some embodiments of the herein disclosed subject-matter include at least one of the following:

1. Using the flexural and extensional modes of one element, for example of a plate, a disk or a straight beam.
2. Attachment of separate elements with flexural modes on a first partial unit providing a desired vibration mode, wherein these separate elements are attached close to the anchor to achieve the coupling between extensional and flexural modes. These separate elements can for example be attached to springs or supports of the resonator device. The separate elements can be flexural elements, for example beams or plates, which are according to an embodiment fixed to the extensional element in their centre.

Since flexural and extensional modes depend in a similar fashion on the material properties (elastic modulus E, density ρ and Poisson ratio ν) as is shown from equations (1) and (2), the design which gives optimal Q-factor is assumed to not strongly depend on these material properties.

LIST OF REFERENCE SIGNS 100, 200 resonator device
102, 202 vibration unit
104, 204 anchor
106, 206 base
108 electrode
109 actuation voltage
110 ground
212 first partial (vibration) unit
212a plate-shaped element
212b tab
214 second partial (vibration) unit
216 vibrational motion of 214
218 vibrational motion of 212a

The invention claimed is:
1. Resonator device comprising:
a base comprising an anchor;
a vibration unit connected to said anchor;
said vibration unit being configured to have a desired first extensional vibration mode; and
said vibration unit being configured to have a second flexural vibration mode different from said first vibration mode;
wherein the first vibration mode and the second vibration mode destructively interfere at the anchor,
said vibration unit being a single plate-shaped vibration element configured to provide both said first extensional vibration mode and said second flexural vibration mode.
2. Resonator device according to claim 1,
said base comprising a single anchor;
said vibration unit being plate-shaped; and
and said vibration unit having a central portion connected to said single anchor.

3. Resonator device according to claim 1, wherein one mode of said first vibration mode and said second vibration mode is an extensional mode and the other mode is a flexural mode.

4. Resonator device according to claim 1, wherein the ratio of the resonance frequency of the second vibration mode over the resonance frequency of the first vibration mode has a value between 0.9 and 1.1.

5. Resonator device according to claim 1, wherein the resonance frequency of the second vibration mode is larger than the resonance frequency of the first vibration mode.

6. Resonator device according to claim 1, wherein the resonance frequency of the second vibration mode is substantially equal to the resonance frequency of the first vibration mode.

7. Resonator device according to claim 1, wherein said resonator device is a micro-electro-mechanical system.

8. A method of optimizing a Q-factor of a resonator device comprising a vibration unit connected to an anchor, the method comprising:

configuring said vibration unit to have a desired first vibration mode; and configuring said vibration unit to have a second vibration mode different from said first vibration mode;

wherein the first vibration mode and the second vibration mode destructively interfere at the anchor, wherein configuring a vibration unit to have a desired first vibration mode comprises configuring lateral dimensions of a plate-shaped element of said vibration unit such that said plate-shaped element has said first vibration mode in the form of an extensional mode; and configuring said vibration unit to have a second vibration mode comprises configuring a thickness of said plate-shaped element such that said plate-shaped element has said second vibration mode in the form of a flexural mode.

* * * * *